United States Patent
Van der Spiegel et al.

(10) Patent No.: US 8,471,189 B2
(45) Date of Patent: Jun. 25, 2013

(54) CMOS LINEAR VOLTAGE/CURRENT DUAL-MODE IMAGER

(75) Inventors: Jan Van der Spiegel, Philadelphia, PA (US); Viktor Gruev, Philadelphia, PA (US); Zheng Yang, Philadelphia, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 1003 days.

(21) Appl. No.: 12/301,400

(22) PCT Filed: May 18, 2007

(86) PCT No.: PCT/US2007/011925
§ 371 (c)(1),
(2), (4) Date: Apr. 1, 2009

(87) PCT Pub. No.: WO2007/136764
PCT Pub. Date: Nov. 29, 2007

(65) Prior Publication Data
US 2010/0060622 A1  Mar. 11, 2010

Related U.S. Application Data

(60) Provisional application No. 60/802,011, filed on May 19, 2006.

(51) Int. Cl.
*H01L 27/00* (2006.01)
*H01L 31/00* (2006.01)
*H01J 40/14* (2006.01)

(52) U.S. Cl.
USPC .............. 250/208.1; 250/214 R; 250/214.1; 348/308

(58) Field of Classification Search
USPC .............. 250/208.1, 214 R, 214.1, 214 SW, 250/214 C, 214 L, 214 LS; 348/248, 300–310, 348/317–319; 345/211, 213, 214
See application file for complete search history.

(56) References Cited

U.S. PATENT DOCUMENTS 5,909,026 A * 6/1999 Zhou et al. ................. 250/208.1
5,933,190 A   8/1999 Dierickx et al.
(Continued)

FOREIGN PATENT DOCUMENTS

JP  11-103420   4/1999
JP  2005-277513  10/2005

OTHER PUBLICATIONS

Fossum, E.R., "CMOS image sensors: electronic camera-on-a-chip," IEEE Trans. Electron. Devices, Oct. 1997, 44(10), 1689-1698.
(Continued)

*Primary Examiner* — Georgia Y Epps
*Assistant Examiner* — Don Williams
(74) *Attorney, Agent, or Firm* — Woodcock Washburn, LLP

(57) ABSTRACT

A CMOS image sensor that is capable of both voltage- and current-mode operations selects the mode based on the position of mode switches. Each pixel on the imager has a single transistor acting as either source follower for voltage readout, or transconductor for current readout. The two modes share the same readout lines, but have their own correlated double sampling (CDS) units for noise suppression. A current-mode readout technique using a velocity-saturated short-channel transistor may be used to achieve high linearity. An image array may be formed as a mixture of 3 types of pixels with identical photodiodes and access switches. The readout transistors are optimally sized for their designated mode of operation. Alternatively, two readout transistors are provided per pixel, each individually optimized for the desired mode of operation.

35 Claims, 9 Drawing Sheets

U.S. PATENT DOCUMENTS

| | | | |
|---|---|---|---|
| 6,355,965 | B1 | 3/2002 | He et al. |
| 6,373,050 | B1 | 4/2002 | Pain et al. |
| 7,435,937 | B2 * | 10/2008 | Takano et al. ............ 250/214 R |
| 7,582,857 | B2 * | 9/2009 | Gruev et al. ................. 250/225 |
| 2006/0011807 | A1 | 1/2006 | Lee et al. |

OTHER PUBLICATIONS

El Gamal, A. et al., "CMOS image sensors," IEEE Circuits Devices Mag., May/Jun. 2005, 21(3), 6-20.

Gruev, V. et al., "Implementation of steerable spatiotemporal image filters on the focal plane," IEEE Trans. Circuits Syst. II, Apr. 2002, 49(4), 233-244.

Gruev, V. et al., "Linear current mode imager with low fix pattern noise," Proc. IEEE ISCAS '04, vol. 4, 2004, pp. 860-863.

Hughes et al., "$S^3I$: The seamless $S^2I$ switched-current cell," Proc. IEEE ISCAS '97, vol. 1, Jun. 9-12, 1997, Hong Kong, pp. 113-116.

\* cited by examiner

CMOS LINEAR VOLTAGE/CURRENT DUAL-MODE IMAGER

CROSS-REFERENCE TO RELATED APPLICATIONS

This application is the National Stage of International Application No. PCT/US2007/011925 filed May 18, 2007, which claims the benefit of U.S. Provisional Application No. 60/802,011, filed May 19, 2006, the disclosure of which is incorporated herein by reference in its entirety.

FIELD OF THE INVENTION

The invention relates to an imaging device and, more particularly, to a linear voltage/current dual-mode imager that allows for mode switching and increased linearity.

BACKGROUND OF THE INVENTION

CMOS active pixel sensors (APS) incorporate either voltage- or current-mode readout. Voltage-mode readout has been in use since the first 3-transistor (3T) CMOS APS imager disclosed by Fossum, "CMOS image sensors: electronic camera-on-a-chip," *IEEE Trans. Electron. Devices*, Vol. 44, No. 10, pp. 1689-1698, 1997, and is still the dominant choice of CMOS imagers in the market today (see, El Gamal, et al. "CMOS image sensors," *IEEE Circuits Devices Mag.*, Vol. 21, No. 3, pp. 6-20, 2005). Current-mode readout is used mostly to facilitate focal-plane image processing, because many analog computations can be easily done in the current domain as described, for example, by Gruev, et al., "Implementation of steerable spatiotemporal image filters on the focal plane," *IEEE Trans. Circuits Syst. II*, Vol. 49, No. 4, pp. 233-244, 2002. Despite this advantage, most current-mode imagers suffer from higher noise level, or poorer image quality. An imager is desired that provides improved image quality while also facilitating focal-plane image processing. The present invention is provided to meet this need.

SUMMARY OF THE INVENTION

The invention relates to a dual-mode imager that is capable of both voltage-mode and current-mode readout. The entire pixel array can be set up in either mode by switches outside the array. Having a unified layout and access scheme, pixels may be mixed with readout transistors that are the same or optimized for each mode together in the same array, to establish a fair comparison of their performance in the two operating modes. One correlated double sampling (CDS) unit is included for each mode and shared by all the pixels to reduce fixed pattern noise (FPN).

In an exemplary embodiment, a voltage/current dual-mode imager receives output from an addressed pixel in a pixel array and provides the pixel output to a voltage-mode readout circuit and/or a current-mode readout circuit under control of a mode switch that is selectively controlled to provide the output of the pixel to either the voltage-mode readout circuit or the current-mode readout circuit. The current mode readout circuit operates in a linear region current mode under first bias conditions to a linear region of the readout transistor and operates in a velocity saturation current mode under second bias conditions to a saturation region of the readout transistor. The size of the respective readout transistors is optimized based on the mode of operation and the desired sensitivity, linearity, and noise performance. Alternatively, a single readout transistor may be used for both voltage and current mode readouts. Mode switches may be controlled to select between the voltage and current modes for a time multiplexed readout. This allows the simultaneous readout of both voltage mode and current mode outputs.

For efficient noise suppression, linear readout of the accumulated photo charge is required. Linear voltage readout is performed by a source follower in each pixel that drives the output line. On the other hand, linear current readout makes use of a transconductor, conventionally implemented by a transistor with fixed VDS operating in the linear region (see, Gruev, et al., "Linear current mode imager with low fix pattern noise," *Proc. IEEE ISCAS '04*, Vol. 4, 2004, pp. 860-863). Another technique of linear current readout in accordance with the invention uses a velocity-saturated short-channel transistor.

BRIEF DESCRIPTION OF THE DRAWINGS

The foregoing summary, as well as the following detailed description of the embodiments of the present invention, will be better understood when read in conjunction with the appended drawings. For the purpose of illustrating the invention, there are shown in the drawings embodiments which are presently preferred. As should be understood, however, the invention is not limited to the precise arrangements and instrumentalities shown. In the drawings.

DETAILED DESCRIPTION OF ILLUSTRATIVE EMBODIMENTS

A detailed description of illustrative embodiments of the present invention will now be described with reference to FIGS. 1-9. Although this description provides a detailed example of possible implementations of the present invention, it should be noted that these details are intended to be exemplary and in no way delimit the scope of the invention.

Dual-Mode Readout Architecture

Figure 1:
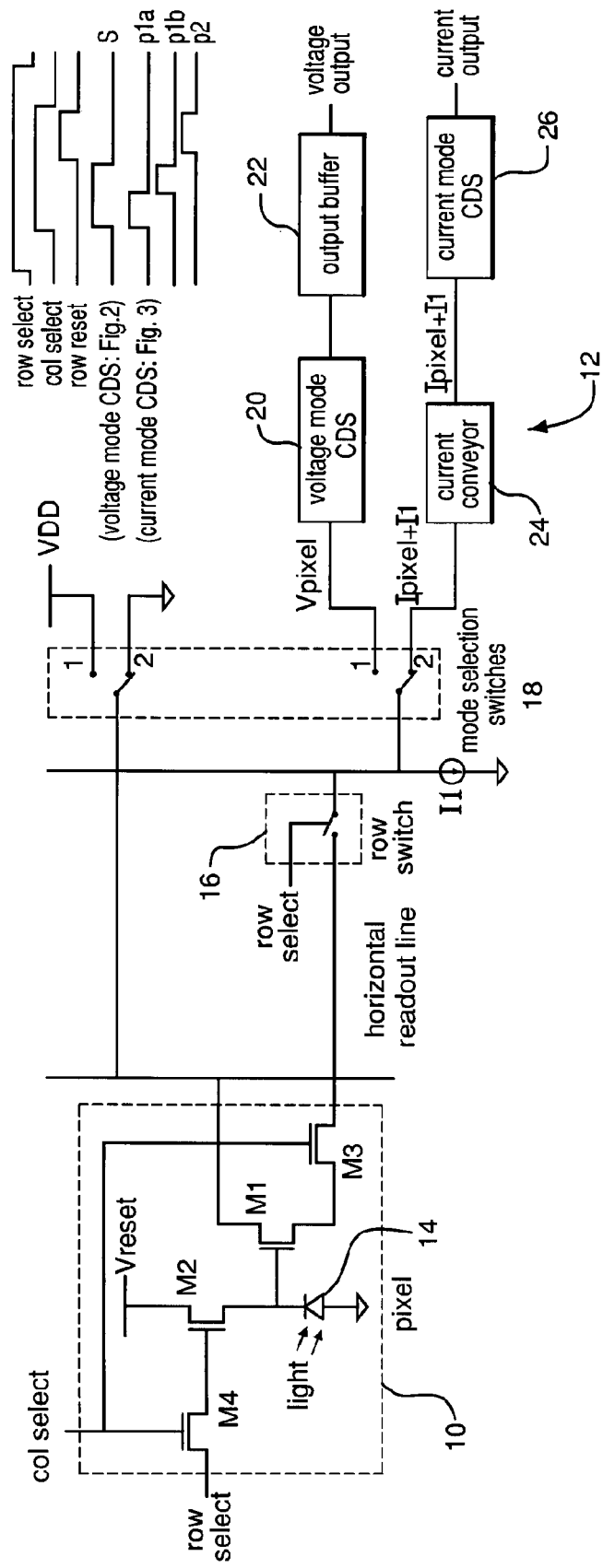
FIG. 1 illustrates one pixel in the imaging array with its readout circuitry.

FIG. 1 illustrates one pixel 10 in the imaging array with its readout circuitry 12. The pixel 10 is based on the classical 3T APS design. Pixel 10 includes a photodiode 14, a readout transistor M1, a reset switch M2 and a column selection switch M3. An additional transistor, M4, is used to be able to reset the pixels individually. Transistor M4 implements an AND function such that the reset pulse, which is common to a row, only triggers the reset in the selected column. Likewise, a row selection switch 16 exists at the end of every row of pixels. The row switches, together with the column switches in the pixels, enable the random access of any pixel in a pixel array.

In voltage-mode readout, the mode selection switches 18 are set to position 1. This connects the drain on every readout transistor to VDD. The source, on the other hand, is connected to a constant current bias I1, for the selected pixel. Accumulated photocharge is detected using the readout transistor M1 as a source follower, in order to drive the readout line associated with a large capacitance. The output circuitry includes a voltage-mode CDS 20 for fixed pattern noise (FPN) suppression, and an output buffer 22. The timing signals for the voltage-mode readout are illustrated in the upper right-hand corner of FIG. 1.

Figure 2:
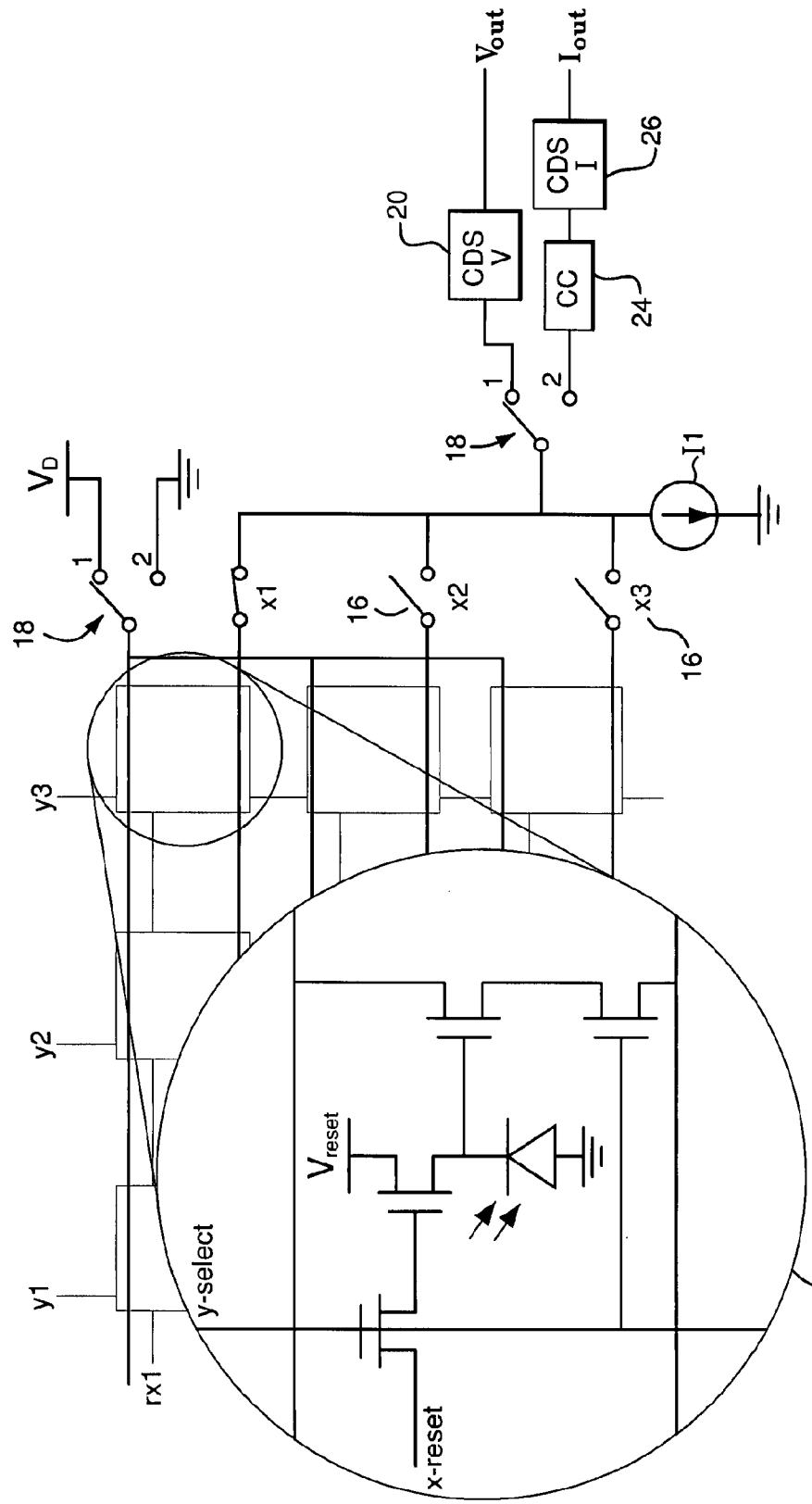
FIG. 2 illustrates a mode selection switch and x and y switches for individual pixel addressing.

Current-mode operation corresponds to position 2 on the mode selection switches 18. In this mode, the common terminals of the readout transistors M1 are connected to ground, while the readout line connects to a current conveyor 24 which masks its large capacitance. Under specific bias conditions, the readout transistor M1 in the selected pixel operates as a transconductor that converts the photocharge linearly to its drain current, which is then copied by the current conveyor 24 and processed by the current mode correlated double sampling (CDS) circuit 26. The drain and source of M1 have exchanged roles in this mode, and readout current now flows into the pixel array. The current source I1 merely adds a constant offset current to meet the input range of the CDS circuit 26. FIG. 2 illustrates the mode selection switch 18 and x and y switches 16 for individual pixel addressing.

Noise Suppression Circuits

As illustrated in FIGS. 1 and 2, the imager of the invention has one voltage-mode and one current-mode CDS unit. They are shared by all the pixels, thus avoiding mismatch errors introduced with other row- or column-based CDS approaches.

Voltage-Mode CDS

Figure 3:
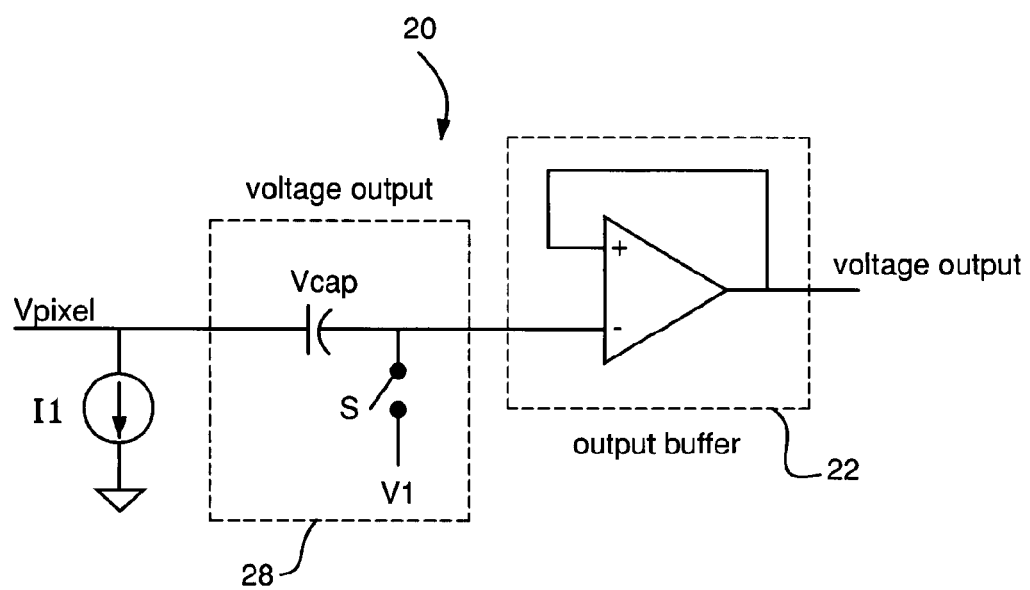
FIG. 3 illustrates an exemplary voltage-mode readout circuit.

The voltage-mode readout circuit 20 is shown in FIG. 3. The CDS function is performed by a simple switched capacitor voltage memory 28. During the first half of the read operation, the switch s is closed. Assuming an ideal current sink I1, the output of the source follower may be approximated as:

$$V_{pixel} = V_{photo} - V_t \quad (1)$$

where $V_{photo}$ is the gate voltage of M1 at the end of charge accumulation and Vt is the threshold of M1. In this phase, the voltage drop across the capacitor is:

$$V_{cap} = V_{photo} - V_t - V_1 \quad (2)$$

where $V_1$ is a constant voltage used to adjust the output range of the CDS. Next, the switch s is open, and the gate of M1 is reset to $V_{reset}$ (FIG. 1). Since the capacitor maintains the same voltage drop $V_{cap}$, the output of the voltage memory must be $(V_{reset} - V_t) - V_{cap}$, or:

$$V_{out} = V_{reset} - V_{photo} + V_1 \quad (3)$$

As $V_t$ is cancelled out in the equation, the FPN caused by $V_t$ variation among pixels will be corrected. The output of the voltage-mode readout circuit 30 is provided to a display (not shown) via output buffer 22.

Current-Mode CDS

Figure 4:
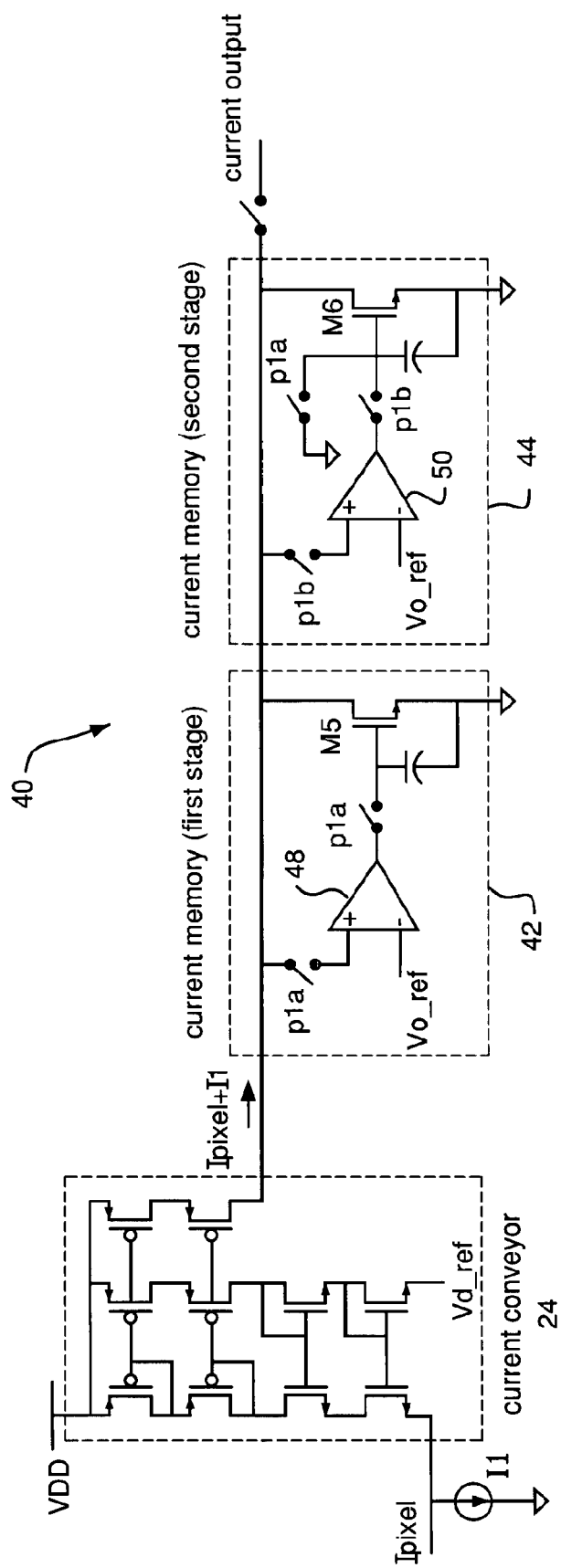
FIG. 4 illustrates an exemplary current-mode readout circuit.

FIG. 4 shows the current-mode readout circuit 40. The two current memory cells 42, 44 (first and second stages) implement the CDS function, while the current conveyor 24 has two purposes: it clamps the voltage on the readout line to $V_{d\_ref}$, and it passes a copy of the input current ($I_{pixel}+I_1$) to the CDS 42, 44. Since the readout line connects to the drain of a readout transistor M1, whose source is grounded, a small $V_{d\_ref}$ may be chosen to bias the device in the linear region. In this case, the pixel current is:

$$I_{pixel} = \beta\left[(V_{photo} - V_t) - \frac{V_{d\_ref}}{2}\right]V_{d\_ref} \quad (4)$$

This current goes to the two-stage current memory 42, 44, which is based on the S³I design in Hughes, et al., "S³I: The seamless S²I switched-current cell," *Proc. IEEE ISCAS '97*, Vol. 1, 1997, pp. 113-116. During the p1a phase, the first memory cell 42 is active. The negative-feedback opamp 48 sets the gate voltage on M5, such that the $I_{DS}$ of M5 is equal to $I_{pixel}+I_1$. Then, the p1a switches are open. At this instance, the gate voltage of M5 is lowered due to negative-charge injection (since N-channel switches are used). M5 now sinks $I_{pixel}+I_1-I_{e1}$. $I_{e1}$, representing the error of the first stage 42, and will be memorized by the second stage 44 during the p1b phase. The second stage 44 is virtually identical to the first stage 42 except that opamp 48 is replaced by opamp 50 and M5 is replaced by M6. At the end of the p1b phase, the second stage again introduces its error $I_{e2}$, which becomes the total error of the CDS 26. However, $I_{e2}$ is only dependent on $I_{e1}$; it is not directly related to the original value of $I_{pixel}$. Therefore it can be regarded as a relatively constant offset error, with only a small variance compared to $I_{e1}$ and $I_{pixel}$.

When the pixel is reset, the expression of pixel current (Equation (4)) would have its $V_{photo}$ replaced by $V_{reset}$. The final output in phase p2 is then the difference of the two pixel currents, plus the error $I_{e2}$, i.e.

$$I_{out} = \beta[(V_{reset} - V_{photo})]V_{d\text{-}ref} + I_{e2} \quad (5)$$

Again, $V_t$ is cancelled out, achieving FPN suppression.

The opamps 48, 50 in the memory cells bring an additional benefit, as they fix the drain voltage of M5 and M6 to $V_{o\_ref}$ during memorization. This eliminates the channel length modulation caused by $V_D$ variation. Both M5 and M6 can be replaced by cascode devices, making them less sensitive to $V_D$ during the output phase (p2). Also, the two opamps 48, 50 can be combined into a single one, shared by both cells.

Linear Current Readout Technique

The conventional linear current readout method, as described in the preceding section, suffers from two sources of nonlinearity. The first is due to mobility dependence on the gate voltage of the readout transistor M1, also known as mobility degradation. In other words, the β in Equation (4) becomes a function of $V_{photo}$. The second is due to voltage drop across the access switches 16. Although the current conveyor 24 clamps the voltage on the readout line, the VDS across the row and column switches 16 are still function of $I_{photo}$. This effect is more severe at the in-pixel switch, whose size cannot be very large. As a result, the $V_D$ of the readout transistor M1 can no longer be represented by the constant $V_{d\_ref}$ in Equation (4).

The readout technique of the invention is immune to the above two causes of nonlinearity since a short-channel device working in the velocity-saturated region is used as the readout transistor M1. Velocity saturation occurs when the electric field along the channel increases beyond a critical value, so that a constant mobility $\mu_n$ cannot be sustained. This critical value $E_{sat}$ is about $1.5 \times 10^4$ V/cm for p-type silicon. The carrier velocity $v_n$, normally expressed as $$-\mu_n \frac{dV}{dx},$$

now reaches a constant $v_{sat}$. Any further increase in the E-field can only decrease the mobility, but will not increase the velocity. The channel current expression under this condition is, as a first approximation:

$$I_{DS} = v_{sat} C_{ox} W (V_{GS} - V_{DSAT} - V_t) \qquad (6)$$

where $V_{DSAT}$ is the drain-source voltage at which velocity saturation comes into play.

$$V_{DSAT} = \frac{E_{sat} L}{1 + \frac{E_{sat} L}{V_{GS} - V_t}} \qquad (7)$$

$V_{DSAT}$ is a function of $V_{GS}$, which determines the degree of velocity saturation. However, when $V_{GS}$ is large (but not so large as to enter linear region), one can regard $V_{DSAT}$ as a constant equal to $E_{SAT} L$. With this approximation, a linear relationship is found between $I_{DS}$ and $V_{GS}$. Also, inconsistent with the saturation of a long-channel device, $I_{DS}$ does not depend on $V_{DS}$ as the channel is pinched off.

Figure 5:
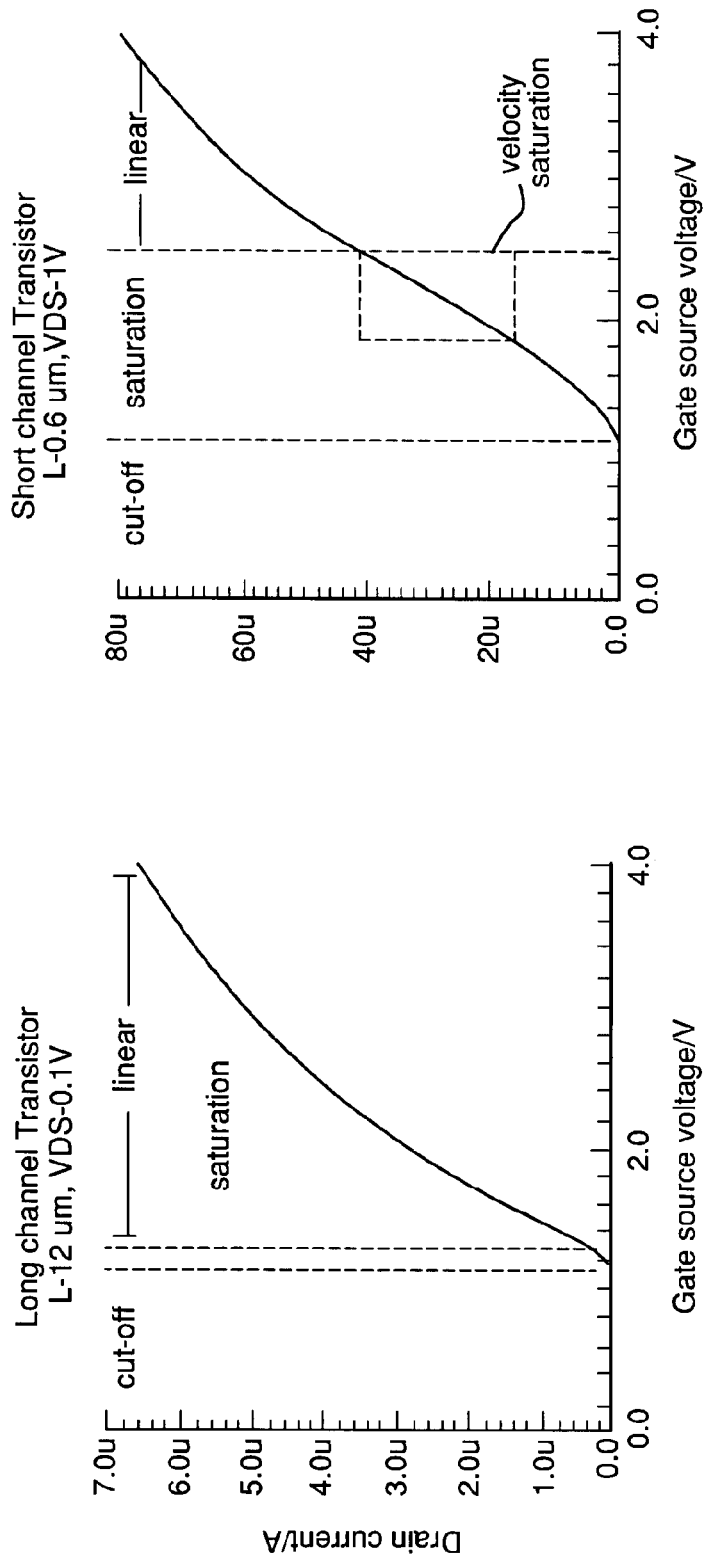
FIG. 5 illustrates graphs comparing the I-V curves of two current-mode readout transistors.
Figure 6:
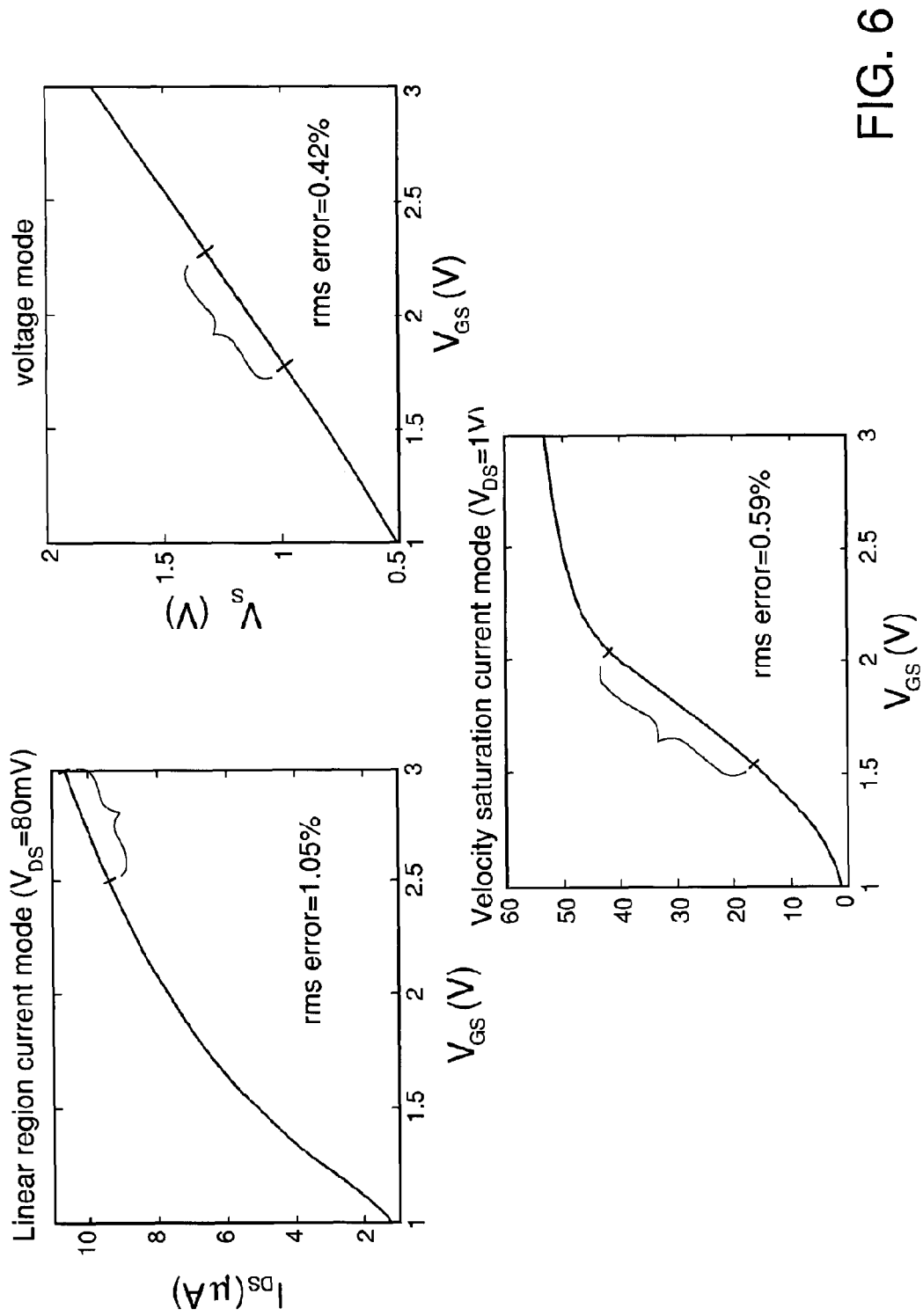
FIG. 6 illustrates the improved linearity of the velocity saturation current mode relative to the linear region current mode.

FIG. 5 compares the I-V curves of two current-mode readout transistors. One can identify the effect of mobility degradation in both of them, as the curves bend downwards for large VGS. However, velocity saturation is observed for the short-channel transistor, identified by the dashed box on the second plot. Despite being linear, this region also has a very high voltage-to-current conversion gain. FIG. 6 illustrates the improved linearity of the velocity saturation current mode relative to the linear region current mode.

The same voltage-mode CDS circuit 20 described above with respect to FIG. 3 can be used with this readout mode. The voltage reference $V_{d\_ref}$ of the current conveyor 24 needs to be large enough to ensure saturation, while a small or zero $I_1$ is desired because of the already-large pixel current. The final output current is:

$$I_{out} = v_{sat} C_{ox} W (V_{reset} - V_{photo}) + I_{e2} \qquad (8)$$

Compared with Equation (5), the technique of the invention not only is insensitive to the signal-dependency of $\mu_n$ and $V_D$, but also corrects for the length mismatches of the readout transistors.

Transistor Sizing in Pixels

In an exemplary embodiment, the pixels 10 have readout transistors M1 that are of the same size and hence not optimized for the voltage mode or the current mode. However, in an alternate embodiment, the readout transistors may be optimized by the mode of operation and one or more such readout transistors provided for each pixel. In such case, it may be assumed, for example, that each pixel 10 has a pitch of 12 μm×12 μm and a fill factor of 31.25%. The reset and access switches all have minimum length. M3 has the largest width, in order to minimize its on-resistance in current-mode readout. M2 has a smaller width in order to reduce the parasitic capacitance at the integrating node, and to limit the charge injection when it switches off from the reset phase. The size of M2 and M4 are chosen to ensure that the pixel 10 can be reset in about 100 ns in all modes, according to a 30 fps output rate. The layout of photodiode and NMOS switches is identical in all pixels 10.

An exemplary embodiment contains 3 different sizes of in-pixel readout transistor M1, each optimized for a specific mode of operation. In the embodiment where a single readout transistor is used for either voltage mode or current mode readouts via mode switches, the size of the readout transistor should be chosen with the consideration of the application's performance criteria.

Voltage-Mode Readout Transistors

The linearity of the voltage-mode signal path is affected by 3 factors: the readout transistor M1's channel length modulation, body effect, and the current sink $I_1$'s output impedance. When the first two factors are considered, the output voltage $V_S$ of the source follower can be written as:

$$V_s = V_G - V_t - V_{ON} \qquad (9)$$

where:

$$V_t = V_{t0} + \gamma \left( \sqrt{|\phi_F| + V_{SB}} - \sqrt{|\phi_F|} \right) \qquad (10)$$

$$V_{ON} = \sqrt{\frac{2I_1}{\beta(1 + \lambda V_{DS})}} \qquad (11)$$

The two equations describe the body effect and the channel length modulation, respectively. They are both function of the source follower output $V_S$, which in turn depends on the input voltage $V_G$. The body effect cannot be eliminated with such a single well process; however, the channel length modulation effect may be reduced by making β large, i.e., using a large $$\frac{W}{L},$$

where W is the width and L is the length of the well. This would make $V_{ON}$ close to zero (which has been assumed in Equation (1)) and less dependent on $V_S$ variation.

The nonlinearity caused by a non-ideal current sink $I_1$ can be seen by writing out the small-signal voltage gain function of the source follower:

$$\frac{V_{out}}{V_{in}} = \frac{Gm1}{Gm1 + Gmbs1 + G_L} = \frac{1}{1 + \frac{Gmbs1}{Gm1} + \frac{G_L}{Gm1}} \qquad (12)$$

where $G_L$ is the total conductance after combining Gds1 with the impedance of the load and $I_1$; Gm1 and Gmbs1 are the transconductance and the body transconductance of transistor M1, respectively. Since the current sink $I_1$ has a finite output impedance, its output current $I_1$ will be a function of $V_S$. This means that the Gm1 term in Equation (12) will vary according to the operating point set by $V_S$, yielding a non-constant gain. To reduce this nonlinearity, Gm1 must be made large, by choosing a large $$\frac{W}{L}.$$

This also serves to attenuate the body effect, which shows up as Gmbs1 in the equation.

Thus, in voltage-mode, M1 is required to have a large W and a small L.

Current-Mode Readout Transistors in Linear Region

The sources of nonlinearity in the current readout mode have already been discussed above. Mobility degradation is a short-channel effect and can be reduced by choosing a large L. It is also desirable to have a large $V_{DS}$ on M1, which makes the voltage drop across access switches less significant. This implies a small $$\frac{W}{L}$$

for M1. In short, this mode requires M1 to have a small W and a large L.

Current-Mode Readout Transistors in Velocity Saturation

The onset of velocity saturation requires the E-field along the channel to be greater than $E_{sat}$. The more this field exceeds $E_{sat}$, the more it makes $V_{DSAT}$ constant in Equation (6). Therefore, it is desirable to have a small L. One may also want to choose a small W to limit the pixel current, in order to match the input range of the current-mode CDS unit, which is also used in the linear-region readout mode. However, making W too small is subject to greater transistor mismatches that will not be corrected by CDS.

Simulation Results

Figure 7:
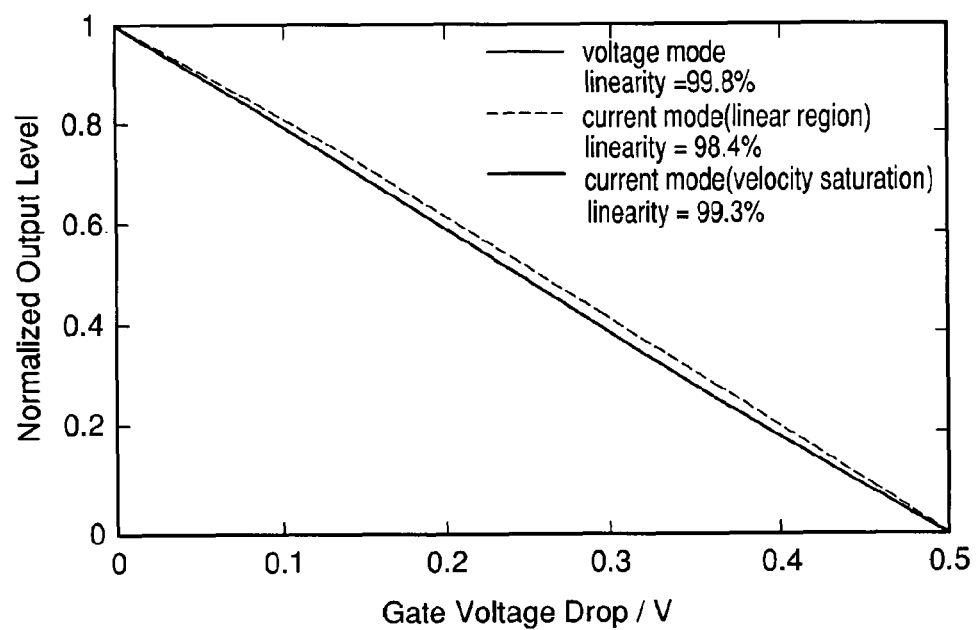
FIG. 7 illustrates the linearity of the 3 optimized readout transistors.

Linearity of the 3 optimized readout transistors were simulated in HSpice. The results are shown in FIG. 7. A DC sweep was performed while the gate voltage of the transistors ramps down by 0.5V, to emulate the accumulation of photocharge. The output levels are normalized to a linear scale between 0 and 1. Linearity is calculated based on the maximum deviation from a best-fit straight line. It is seen that the voltage mode readout transistor yields the best linearity. Velocity-saturated current mode comes a close second, and has a significant improvement over the conventional linear-region current mode.

Figure 8:
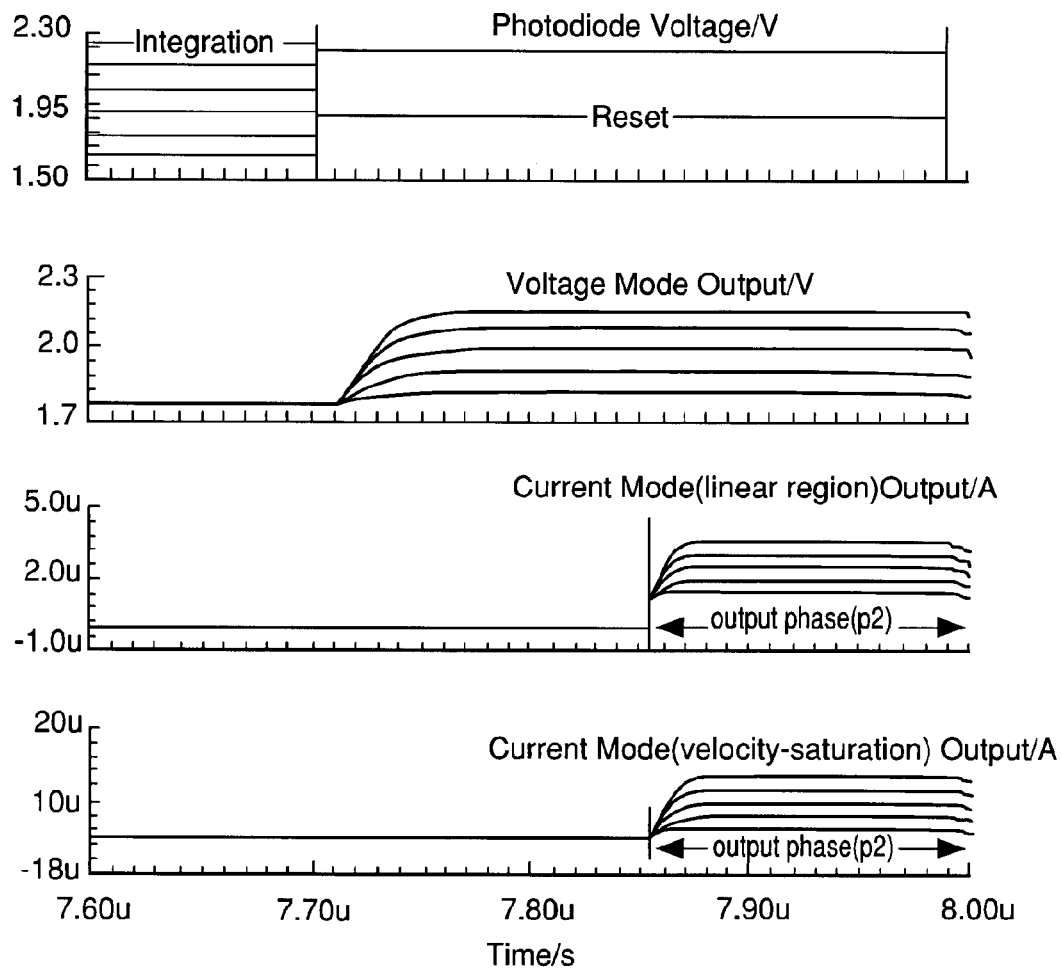
FIG. 8 illustrates a simulated example of the 3 readout modes at different light intensities.
Figure 9:
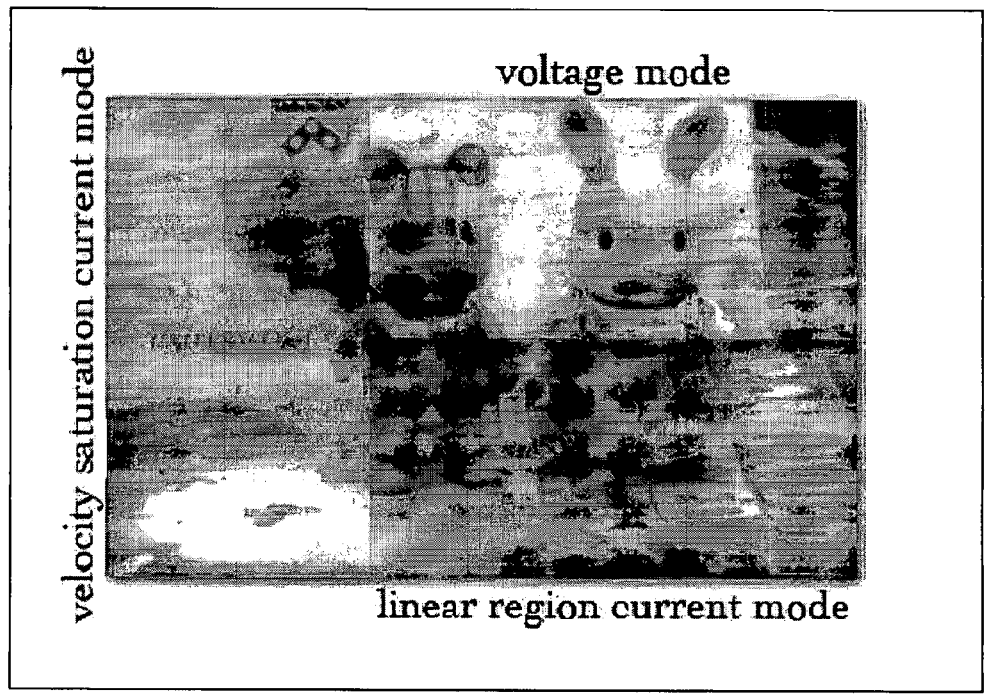
FIG. 9 illustrates sample images for the voltage mode, the linear region current mode, and the velocity saturation current mode.

FIG. 8 shows a simulated example of the 3 readout modes at different light intensity. The outputs exhibit linear steps, in accordance with the voltage on the photodiode at the end of an integration cycle. FIG. 9 illustrates sample images for the voltage mode, the linear region current mode, and the velocity saturation current mode. As illustrated, the voltage mode provides the best image; however, the velocity saturation mode provides a significantly better image than the linear region current mode.

The dual-mode imager of the invention thus actual supports 3 modes, each mode requiring a different sized readout transistor as follows:
voltage mode: large W, small L;
linear region current mode: small W, large L; and
velocity saturation current mode: small W, small L.

The resulting dual mode imager allows one to extract information in the current mode, as for a comparison study, and to optimally display the image in the voltage mode. Each mode is optimized by transistor size. It will be appreciated that the transistors in the velocity saturation mode are smallest and thus saturate more rapidly and are more sensitive. The modes may be time-multiplexed for readout. For example, the voltage mode may be used for odd frames while the current mode is used for even frames.

It should be understood that this invention is not limited to the particular embodiments disclosed, but it is intended to cover modifications within the spirit and scope of the present invention as defined by the appended claims. All such aspects of the invention are intended to be covered by the appended claims.

What is claimed:

1. A voltage/current dual-mode imager that provides the outputs of pixels of an image array to a display, comprising:
   a voltage-mode readout circuit shared by all pixels of the image array;
   a current-mode readout circuit shared by all pixels of the image array; and
   a mode switch selectively controlled to provide the output of each pixel to either said voltage-mode readout circuit in a voltage mode or said current-mode readout circuit in a current mode.

2. An imager as in claim 1, wherein the current mode readout circuit operates in a linear region current mode under first bias conditions to a linear region of a readout transistor of each respective pixel and operates in a velocity saturation current mode under second bias conditions to a saturation region of said readout transistor of each respective pixel.

3. An imager as in claim 2, wherein a smaller readout transistor is used for a pixel in said velocity saturation current mode than in said linear region current mode.

4. An imager as in claim 2, further comprising a first readout transistor for each pixel in said voltage-mode readout circuit, said first readout transistor having a first size, and a second readout transistor for each pixel in said current-mode readout circuit, said second readout transistor having a second size different from said first size, said sizes being optimized based on desired sensitivity, linearity and/or noise performance of each pixel in the image array.

5. An imager as in claim 4, wherein said first readout transistor is optimized for said voltage mode and has a large width and a small length.

6. An imager as in claim 4, wherein said second readout transistor is optimized for said linear region current mode and has a small width and a large length.

7. An imager as in claim 4, wherein said second readout transistor is optimized for said velocity saturation current mode and has a small length and a small width.

8. An imager as in claim 1, wherein the mode switch is controlled to time multiplex the processing of the output of each pixel between said voltage-mode readout circuit and said current-mode readout circuit.

9. An imager as in claim 1, wherein each pixel in said image array is output to said voltage-mode readout circuit or said current-mode readout circuit under control of said mode switch and respective address lines that address each pixel.

10. A voltage/current dual-mode imager that provides the outputs of pixels of an image array to a display, comprising:
    an image array comprising a plurality of pixels, each pixel having a readout transistor;
    a voltage-mode readout circuit responsive to outputs of each of said readout transistors of said image array;
    a current-mode readout circuit responsive to outputs of each of said readout transistors of said image array; and
    a mode switch selectively controlled to either provide the output of the readout transistors of each pixel of said image array to said voltage-mode readout circuit in a voltage mode or to said current-mode readout circuit in a current mode.

11. An imager as in claim 10, wherein the current mode readout circuit operates in a linear region current mode under first bias conditions to a linear region of said readout transistors of each pixel and operates in a velocity saturation current mode under second bias conditions to a saturation region of said readout transistors of each pixel.

12. An imager as in claim 11, wherein a smaller readout transistor is used for each readout transistor in said velocity saturation current mode than in said linear region current mode.

13. An imager as in claim 11, wherein said second readout transistor is optimized for said velocity saturation current mode and has a small length and a small width.

14. An imager as in claim 10, wherein the mode switch is controlled to time multiplex the processing of the outputs of the pixels in the image array between said voltage-mode readout circuit and said current-mode readout circuit.

15. An imager as in claim 10, wherein each pixel in the image array is output to said voltage-mode readout circuit or said current-mode readout circuit under control of said mode switch and respective address lines that address each pixel in the pixel array.

16. An imager as in claim 10, further comprising a first readout transistor for each pixel in said voltage-mode readout circuit, said first readout transistor having a first size, and a second readout transistor for each pixel in said current-mode readout circuit, said second readout transistor having a second size different from said first size, said sizes being optimized based on desired sensitivity, linearity, and/or noise performance of each pixel in the image array.

17. An imager as in claim 16, wherein said first readout transistor is optimized for said voltage mode and has a large width and a small length.

18. An imager as in claim 16, wherein said second readout transistor is optimized for said linear region current mode and has a small width and a large length.

19. An imager as in claim 10, wherein the voltage mode readout circuit comprises a switched capacitor voltage memory and an output buffer connected in series.

20. An imager as in claim 10, wherein the current mode readout circuit comprises a current conveyor and two current memory cells connected in series.

21. A voltage/current dual-mode imager that provides the outputs of pixels of an image array to a display, comprising:
an image array comprising a plurality of pixels, each pixel having a first readout transistor for a voltage mode, said first readout transistor having a first size, and each pixel having a second readout transistor for a current mode, said second readout transistor having a second size different from said first size;
a voltage-mode readout circuit responsive to outputs of each of said first readout transistors of said image array; and
a current-mode readout circuit responsive to outputs of each of said second readout transistors of said image array,
wherein the outputs of said first and second readout transistors are provided in parallel simultaneously.

22. An imager as in claim 21, wherein the current mode readout circuit operates in a linear region current mode under first bias conditions to a linear region of said second readout transistor of each pixel and operates in a velocity saturation current mode under second bias conditions to a saturation region of said second readout transistor of each pixel.

23. An imager as in claim 22, wherein a smaller readout transistor is used for each second readout transistor in said velocity saturation current mode than in said linear region current mode.

24. An imager as in claim 22, wherein said second readout transistor of each pixel is optimized for said linear region current mode and has a small width and a large length.

25. An imager as in claim 22, wherein said second readout transistor of each pixel is optimized for said velocity saturation current mode and has a small length and a small width.

26. An imager as in claim 21, wherein said first readout transistor of each pixel is optimized for said voltage mode and has a large width and a small length.

27. An imager as in claim 21, wherein the voltage mode readout circuit comprises a switched capacitor voltage memory and an output buffer connected in series.

28. An imager as in claim 21, wherein the current mode readout circuit comprises a current conveyor and two current memory cells connected in series.

29. A current/voltage dual mode imaging method, comprising the steps of:
connecting outputs of each pixel of an image array to a voltage mode readout circuit shared by all pixels of the image array for processing in a voltage mode;
connecting outputs of each pixel of the image array to a current mode readout circuit shared by all pixels of the image array for processing in a current mode; and
selecting the voltage mode or the current mode for the pixels of the image array by moving a mode switch between a first position for selecting said voltage mode and a second position for selecting said current mode.

30. A method as in claim 29, wherein the current mode readout circuit is operated in a linear region current mode under first bias conditions to a linear region of a readout transistor of each respective pixel and is operated in a velocity saturation current mode under second bias conditions to a saturation region of said readout transistor of each respective pixel.

31. A method as in claim 29, wherein the mode switch is controlled to time multiplex the processing of the outputs of the pixels between said voltage-mode readout circuit and said current-mode readout circuit.

32. A method as in claim 29, wherein each pixel in the image array is output to said voltage mode readout circuit or said current-mode readout circuit under control of said mode switch and respective address lines that address each pixel.

33. A current/voltage dual mode imaging method, comprising the steps of:
connecting outputs of each pixel of an image array to a first readout transistor of a first size for a voltage mode and to a second readout transistor of a second size for a current mode, said second size being different from said first size; and
simultaneously providing outputs of said first readout transistor to a voltage mode readout circuit shared by all pixels of the image array for processing in a voltage mode and outputs of said second readout transistor to a current mode readout circuit shared by all pixels of the image array for processing in a current mode.

34. A method as in claim 33, wherein the current mode readout circuit is operated in a linear region current mode under first bias conditions to a linear region of a readout transistor of each respective pixel and is operated in a velocity saturation current mode under second bias conditions to a saturation region of said readout transistor of each respective pixel.

35. A method as in claim 33, further comprising the step of selecting the sizes of said first and second readout transistors based on desired sensitivity, linearity, and/or noise performance of each pixel in the image array.

* * * * *

UNITED STATES PATENT AND TRADEMARK OFFICE
CERTIFICATE OF CORRECTION

PATENT NO.       : 8,471,189 B2                              Page 1 of 1
APPLICATION NO. : 12/301400
DATED            : June 25, 2013
INVENTOR(S)      : Van der Spiegel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1139 days.

Signed and Sealed this
Eighth Day of September, 2015

Michelle K. Lee
*Director of the United States Patent and Trademark Office*